United States Patent
Moll et al.

(10) Patent No.: US 7,642,776 B2
(45) Date of Patent: Jan. 5, 2010

(54) METHOD TO DETERMINE AN ACQUISITION SEQUENCE IN AN IMAGING METHOD FOR GENERATION OF 2D SLICE IMAGES

(75) Inventors: Christoph Moll, Munich (DE); Martin C. Mueller, Munich (DE); Andreas Schief, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 287 days.

(21) Appl. No.: 11/862,298

(22) Filed: Sep. 27, 2007

(65) Prior Publication Data

US 2008/0077008 A1 Mar. 27, 2008

(30) Foreign Application Priority Data

Sep. 27, 2006 (DE) .................. 10 2006 045 681

(51) Int. Cl.
*G01V 3/00* (2006.01)
(52) U.S. Cl. .................................................. 324/307
(58) Field of Classification Search ......... 324/300–322; 600/410–435
See application file for complete search history.

(56) References Cited

U.S. PATENT DOCUMENTS 5,378,985 A * 1/1995 Hinks .......................... 324/309
5,420,509 A * 5/1995 Takai .......................... 324/309
6,489,766 B1 * 12/2002 Alsop ......................... 324/313
6,618,605 B1 * 9/2003 Wolff et al. .................. 600/410
6,888,349 B2 * 5/2005 Fautz .......................... 324/309
7,283,862 B1 * 10/2007 Slavin et al. ................. 600/420
2005/0033151 A1 2/2005 Wu et al.

FOREIGN PATENT DOCUMENTS

DE 102 13 848 A1 10/2003

OTHER PUBLICATIONS

"Handbook of MRI Pulse Sequences," Matt et al. Section 14.2.2 Inversion Recovery Acquisition Strategies, pp. 611-615 (2004).

* cited by examiner

*Primary Examiner*—Brij B Shrivastav
*Assistant Examiner*—Dixomara Vargas
(74) *Attorney, Agent, or Firm*—Schiff Hardin LLP

(57) ABSTRACT

In a method for determination of an acquisition sequence for slice plane data of slice planes of an examination subject, the slice plane data are acquired with measurement sequences that each includes a preparation phase and a measurement phase temporally separated from the preparation phase. For n slice planes and a set of sequence parameters that include at least the parameters $T_R^{min}$: minimal repetition time between two measurement sequences of the same slice plane and $T_R^{max}$: maximum repetition time between two measurement sequences of the same slice plane, a periodic acquisition scheme that, temporally expanded, is $[T_R^i, T_R]$-compatible to the k-th degree and has k streams. The association of the n slice planes with the k streams of the acquisition scheme and the order of the slice planes within the respective streams are determined by mixed-integer linear program.

7 Claims, 5 Drawing Sheets

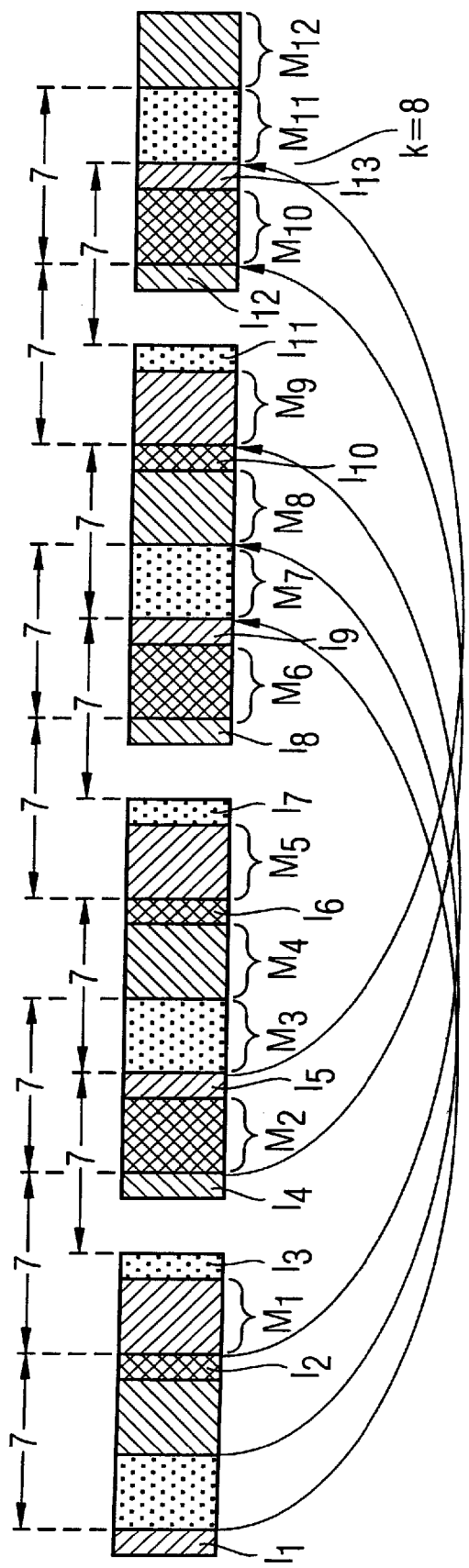

METHOD TO DETERMINE AN ACQUISITION SEQUENCE IN AN IMAGING METHOD FOR GENERATION OF 2D SLICE IMAGES

BACKGROUND OF THE INVENTION

1. Field of the Invention

The present invention concerns the technical field of imaging methods for generation of two-dimensional (2D) slice images. In particular it concerns a method for determination of an acquisition sequence for acquisition of slice plane data of slice planes of an examination subject for an imaging method for generation of slice images belonging to the slice planes.

2. Description of the Prior Art

Data acquisitions from an examination subject in the form of two-dimensional slice images are generated in the examination of patients with a magnetic resonance tomography apparatus. Typically, but not necessarily, the slices images are parallel to one another in order to acquire three-dimensional views of the examination subject in this manner. A number of individual measurements are implemented for each slice image, with the resonance data of the slice planes being acquired line-by-line. In the implementation of an examination, a single measurement completely occupies the magnetic resonance tomography apparatus so that only one measurement can ever be implemented in each open time interval.

Before beginning an examination (i.e. the generation of slice images of an examination subject) the examination subject and special, examination-specific parameters are established by an operating personnel, for example a radiologist or a medical-technical assistant. The operator establishes the slice planes ("spatial slices" or "slices") to be measured, the time duration of the individual measurements and the time interval between the individual measurements. The acquisition then ensues in a computer-controlled manner, with individual measurement sequences being automatically arranged (according to acquisition scheme) into an acquisition sequence for acquisition of the resonance data of all slice planes. The slice images belonging to the slice planes are generated from the resonance data by Fourier transformation.

As is generally known, magnetic resonance tomography is based on the fact that protons and some atomic nuclei exhibit a magnetization that can be aligned by the application of an external magnetic field. If a radio-frequency pulse of suitable frequency is applied perpendicular to the magnetic field, the directed magnetization can be deflected, and a change of a magnetization component parallel to the magnetic field direction ("longitudinal magnetization") and perpendicular to the magnetic field direction ("transverse magnetization") can be caused. The longitudinal magnetization subsequently returns again to the equilibrium state due to spin-grid interactions, which can be described with a time constant $T_1$. The transverse magnetization decays with a characteristic decay time (described by the time constant $T_2$) due to spin-spin interactions. Tissue properties can be characterized by the two time constants $T_1$, $T_2$ since the resonance signal that is emitted from the body and acquired by measurement apparatuses is dependent on the structure of the tissue, in particular the proton density.

Today two different measurement methods are commonly used for examinations in magnetic resonance tomograph, namely the TSE (Turbo Spin Echo) measurement method and the IRTSE (Inversion Recovery Turbo Spin Echo) measurement method, in which different pulse sequences are used.

In a spin echo pulse sequence a spin system is initially excited via a 90° radio-frequency pulse so that the excited protons precess in phase (phase synchronization) and a transverse magnetization occurs that rotates around the applied external magnetic field with the Larmor frequency. Spin-spin interactions lead to dephasing of the precession movements and thus to $T_2$ relaxation. Before equilibrium is reached, the magnetization is tilted again by a 180° radio-frequency pulse, causing the spins to be phase-synchronized again. The resonance signals are subsequently acquired.

In an inversion recovery pulse sequence, a 180° radio-frequency pulse ("inversion pulse") is initially radiated in order to invert the longitudinal magnetization (anti-parallel position to the external magnetic field). The spins thus are not phase-synchronized, so no transverse magnetization thus arises. Due to the spin-grid relaxation the longitudinal magnetization returns again to equilibrium with the time constant $T_1$. Before the longitudinal magnetization reaches the thermal equilibrium, a 90° radio-frequency signal ("measurement pulse") is radiated by which the momentary magnetization is tilted by 90° (thus perpendicular to the external magnetic field) and thus is converted into a transverse magnetization. The spins now precess in phase and relax with the time constant $T_2$. The resonance signals are subsequently acquired.

It is significant in the IRTSE pulse sequence that a time span that is generally constant for an examination exists between the two radiated radio-frequency pulses. This procedure can be repeated multiple times, with the time between two inversion pulses of the same slice plane being designated as a repetition time. The repetition time should be large enough so that the magnetization is completely repeated at the beginning of a new measurement for the same slice plane.

The IRTSE measurement sequence is now explained in detail with regard to FIG. 1, wherein a single IRTSE measurement sequence of a nuclear magnetic resonance tomography apparatus is exemplarily presented in a schematic manner. The IRTSE measurement sequence shown in FIG. 1 has inversion phase $I_1$ for emission of the inversion pulse with a time duration $T_A=1$ time unit and a measurement phase $M_1$ (composed of two measurement sub-phases $M_{11}$, $M_{12}$) with a total time duration $T_E+T_M=3$ time units. The first measurement sub-phase $M_{11}$ which lasts $T_E=1$ time unit serves for the emission of the measurement pulse. The second measurement sub-phase $M_{12}$ which lasts $T_M=2$ time units serves for the actual measurement for acquisition of the resonance signals. In this example the measurement phase $M_1$ encompasses only a single measurement, but further measurements that each occupy two time units could ensue in further measurement sub-phases. A time span $R_1$ with a time duration $T_{GAP}$ of 5 time units (recovery phase) lies between the inversion phase $I_1$ and the associated measurement phase $M_1$.

Various acquisition schemes, which can be classified as "sequential", "overlapping" and "distributed" acquisition schemes, are known for the acquisition of resonance data of 2D slice planes for generation of 2D slice images in an IRTSE imaging method by nuclear magnetic resonance tomographs (see, for example, Matt A. et al., "Handbook of MRI Pulse Sequences", Elsevier, Boston 2004, section 14.2.2, pages 611 and the following). The acquisition schemes known in the prior art are now explained in detail with reference to FIG. 2 through 4.

FIG. 2 is considered first, wherein a sequential acquisition scheme is presented. The sequence acquisition of resonance data is based on the principle that measurement sequences are implemented without an inversion phase or measurement phase of another measurement sequence being implemented in the recovery phase of a considered measurement sequence (which recovery phase lies between the inversion phase and the measurement phase). As is illustrated in FIG. 2, a first measurement sequence is first implemented which comprises inversion phase $I_1$ and measurement phase $M_1$ with a recovery phase $R_1$ situated in-between. The measurement phase $M_1$ itself is composed of a number of individual measurements, as is illustrated by the vertical lines. A further measurement sequence subsequently follows comprising inversion phase $I_2$ and measurement phase $M_2$ with an intervening recovery phase $R_2$ and so forth. A number of measurement sequences are implemented in this manner until all resonance data from all slice planes of the examination subject are acquired. The resonance data of various slice planes are acquired in adjacent measurement sequences in order to adhere to the required repetition times between two measurements of the same slice plane. A disadvantage in the sequential acquisition scheme is the large time requirement for the complete acquisition of the resonance data since the recovery phase between inversion phase and measurement phase elapses as "unused" time.

An acquisition scheme superior to the sequence acquisition scheme in this regard is the overlapping acquisition scheme which is illustrated in FIG. 3. The overlapping acquisition of image data is based on the principle that a further inversion phase of the subsequent measurement sequence is implemented in the intervening recovery phase in each measurement sequence. This is exemplarily illustrated for two measurement sequences in FIG. 3. According to FIG. 3, an inversion phase $I_1$ of a first measurement sequence is implemented first, followed by an inversion phase $I_2$ of a following second measurement sequence within the recovery phase $R_1$ of the first measurement sequence. After expiration of the recovery phase $R_1$ of the first measurement sequence, a measurement phase $M_1$ of the first measurement sequence follows within the recovery phase $R_2$ of the second measurement sequence. The measurement phase $M_1$ of the first measurement sequence has a first measurement sub-phase $M_{11}$ for emission of the measurement pulse (measurement preparation) and two further measurement sub-phases $M_{12}$, $M_{13}$, namely two individual measurements for acquisition of the resonance signal. A measurement phase $M_2$ (comprising three measurement sub-phases $M_{21}$, $M_{22}$, $M_{23}$) of the second measurement sequence follows this. The first measurement sub-phase $M_{21}$ serves in a corresponding manner for the emission of the measurement pulse while the second and third measurement sub-phases are two individual measurements for acquisition of the resonance signal.

Two further inversion phases subsequently follow, followed by two further measurement phases and so forth until the resonance data of all slice planes are acquired. In the number example shown in FIG. 3 16 time units are necessary for implementation of two measurement sequences with the overlapping acquisition scheme when the inversion phase takes one time unit, the recovery phase takes five time units and the measurement phase takes five time units in total in every measurement sequence. In order to execute these four individual measurements with the sequential acquisition scheme, this would have to be executed twice with two individual measurements each, with a total time requirement of 22 time units.

The distributed acquisition scheme which is illustrated in FIG. 4 offers a further improvement in this regard. The distributed acquisition of resonance data is based on the principle that a measurement phase of the preceding measurement sequence and an inversion phase of the subsequent measurement sequence are implemented in the intervening recovery phase in each measurement sequence. This is exemplarily illustrated for a number of measurement sequences in FIG. 4. According to FIG. 4, at least one inversion phase $I_1$ of a first measurement sequence is implemented first, followed by a measurement phase $M_0$ (comprising two measurement sub-phases $M_{01}$, $M_{02}$; $M_{01}$ for a measurement pulse (measurement preparation) and $M_{02}$ for a single measurement) of a preceding measurement sequence and an inversion phase $I_2$ of a following second measurement sequence within the recovery phase $R_1$ of the first measurement sequence. Following this are a measurement phase $M_1$ (including two measurement sub-phases $M_{11}$, $M_{12}$; $M_{11}$ for a measurement pulse (measurement preparation) and $M_{12}$ for a single measurement) of the first measurement sequence and an inversion phase $I_3$ of a following third measurement sequence within the recovery phase $R_2$ of the second measurement sequence. Following this are a measurement phase $M_2$ (comprising two measurement sub-phases $M_{21}$, $M_{22}$; $M_{21}$ for a measurement pulse (measurement preparation) and $M_{22}$ for a single measurement) of the second measurement sequence and an inversion phase $I_4$ of a following fourth measurement sequence within the recovery phase $R_3$ of the third measurement sequence. A measurement phase $M_3$ (including two measurement sub-phases $M_{31}$, $M_{32}$; $M_{31}$ for a measurement pulse (measurement preparation) and $M_{32}$ for a single measurement) of the fourth measurement sequence and an inversion phase $I_5$ of a following fifth measurement sequence follow within the recovery phase $R_4$ of the fourth measurement sequence, the said fifth measurement sequence not being shown in FIG. 4. This scheme is periodically repeated until all resonance data of all slice planes are acquired. The measurement sequences from FIG. 4 correspond to the exemplary pattern of a measurement sequence as illustrated in FIG. 1.

Only 10 time units are thus required given a distributed acquisition scheme for implementation of two individual measurements. Relative to the sequential acquisition scheme, a distinct shortening of the total measurement duration of an examination can inasmuch be achieved both via the use of the distributed acquisition scheme and via the use of the overlapping acquisition scheme.

Notwithstanding, the distributed acquisition scheme is plagued with the disadvantage that the efficiency of the utilization of the recovery phases depends on the ratio of the sum made up of time duration of the inversion phase of the preceding measurement sequence and time durations of the individual measurements of the subsequent measurement sequence to the time duration of the recovery phase of a considered measurement sequence. If relatively few individual measurements or comparably short individual measurements are implemented, such that the summed time duration of the time durations of the individual measurements is relatively small, the efficiency is also comparably poor, and vice versa. The time duration of an examination inasmuch significantly depends on the selected examination subject and the parameters selected for this purpose.

SUMMARY OF THE INVENTION

In contrast to the above-described methods, an object of the present invention is to provide a method for determination of an acquisition sequence for acquisition of slice plane data of an examination subject in an imaging method for generation of 2D slice images, with which a shortening of the total duration to determine the slice plane data of all slice planes of an examination subject can be achieved compared to the conventional acquisition sequences.

This object is achieved according to the invention by a method for determination of an acquisition sequence for acquisition of slice plane data of slice planes of an examination subject in an imaging method for generation of slice images of the examination subject (the slice images belonging to the slice planes) wherein the slice plane data are acquired by measurement sequences that each include a preparation phase and a measurement phase with at least one measurement for acquisition of slice plane data, the measurement phase being temporally separated from the preparation phase.

In the inventive method, a periodic acquisition scheme that, temporally expanded, is $\lfloor T_R^{min}, T_R^{max} \rfloor$-compatible to the k-th degree and encompasses k streams, and an association of n slice planes with the k streams of the acquisition scheme, as well as an order of the slice planes within the respective stream, are determined by a mixed-integer linear program (MILP) for the n slice planes and one set of sequence parameters which has as parameters at least $T_R^{min}$ (i.e. the minimal repetition time between two measurement sequences of the same slice plane) and $T_R^{max}$ (i.e. the maximum repetition time between two measurement sequences of the same slice plane). An acquisition scheme for acquisition of the slice plane data results from the association of the n slice planes with the k streams of the acquisition scheme as well as from the order of the slice planes within the respective stream.

A line-by-line association of the n slice planes with the k streams of the acquisition scheme thus ensues in an advantageous manner.

In an embodiment of the inventive method, the numbers of measurements of the k streams in the determination of the periodic acquisition scheme is constant.

In the inventive method the measurement phase can encompass a number of measurement sub-phases, namely a first measurement sub-phase that serves for the measurement preparation and at least one further measurement sub-phase in which the slice plane data are acquired.

The inventive method can be advantageously applied to the acquisition of resonance data in an imaging method of a nuclear magnetic resonance tomography apparatus. In the event that it is hereby an IRTSE acquisition sequence, the preparation phase corresponds to the inversion phase for emission of the inverted radio-frequency pulse. The measurement phase serves for the acquisition of resonance data, wherein, in each measurement phase, a first measurement sub-phase for emission of the measurement pulse and at least one further (second, third, fourth . . . ) measurement sub-phase for implementation of the actual measurement, i.e. serves for the acquisition of resonance data of a slice plane of the examination subject.

The invention also includes an electronic control device for a magnetic resonance tomography apparatus that is suitable for data processing and is provided with a program code that includes control commands (a data structure) that prompt the control device to implement a method as described above.

Furthermore, the invention includes a machine-readable program code (data structure) (computer program) for an electronic control device of a magnetic resonance tomography apparatus that is suitable for data processing, this program code including control commands that prompt the control device to implement a method as described above.

Moreover, the invention includes a storage medium (computer program product) with a machine-readable program code (data structure) as described above stored thereupon.

BRIEF DESCRIPTION OF THE DRAWINGS

FIG. 7 schematically illustrates a cliché with 8 streams, based on the periodic sequence of FIG. 5.

DESCRIPTION OF THE PREFERRED EMBODIMENTS

Figure 1:
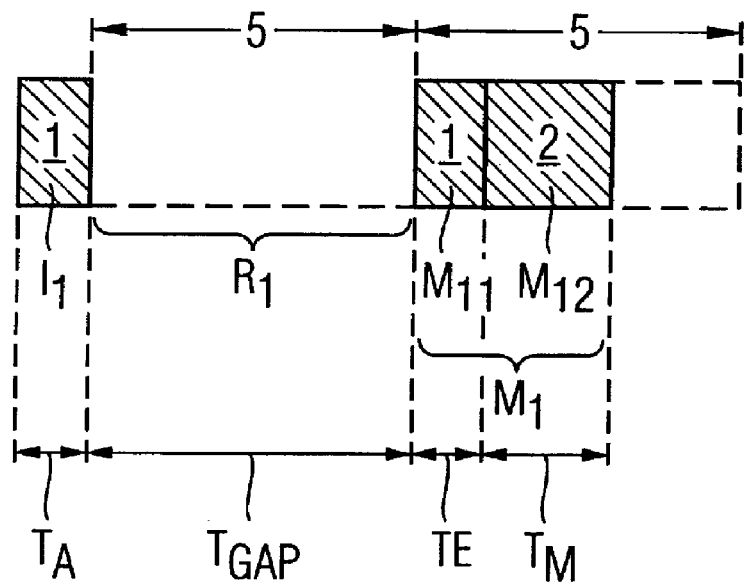
FIG. 1, as discussed above, schematically illustrates a known IRTSE measurement sequence for a magnetic resonance tomography apparatus.
Figure 2:
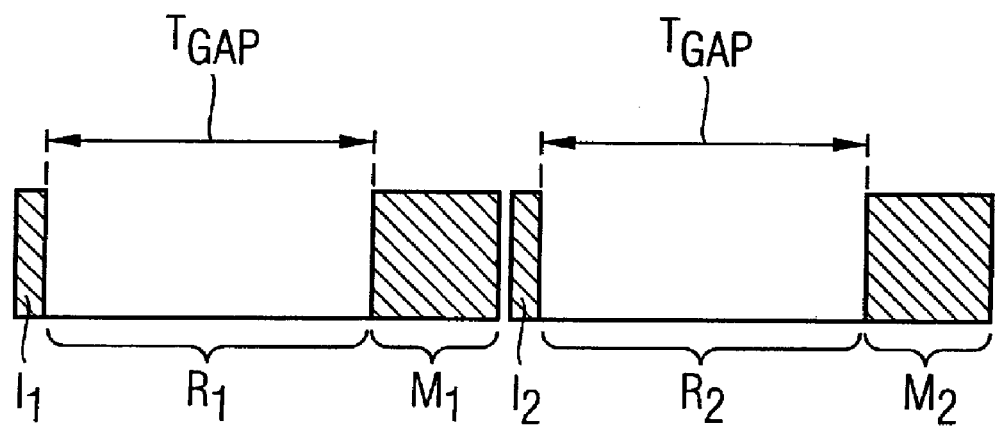
FIG. 2, as discussed above, schematically illustrates a known sequential acquisition scheme for a magnetic resonance tomography apparatus.
Figure 3:
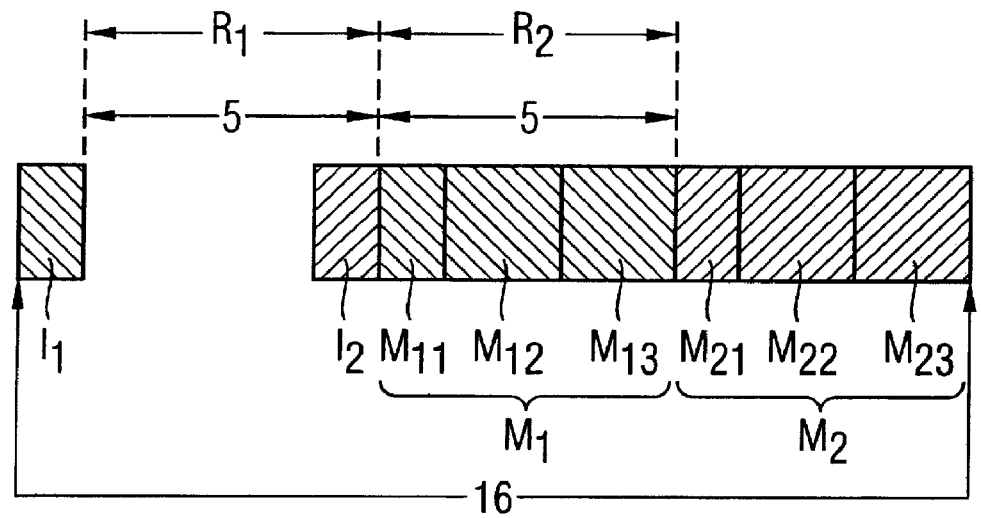
FIG. 3, as discussed above, schematically illustrates a known overlapping acquisition scheme for a magnetic resonance tomography apparatus.
Figure 4:
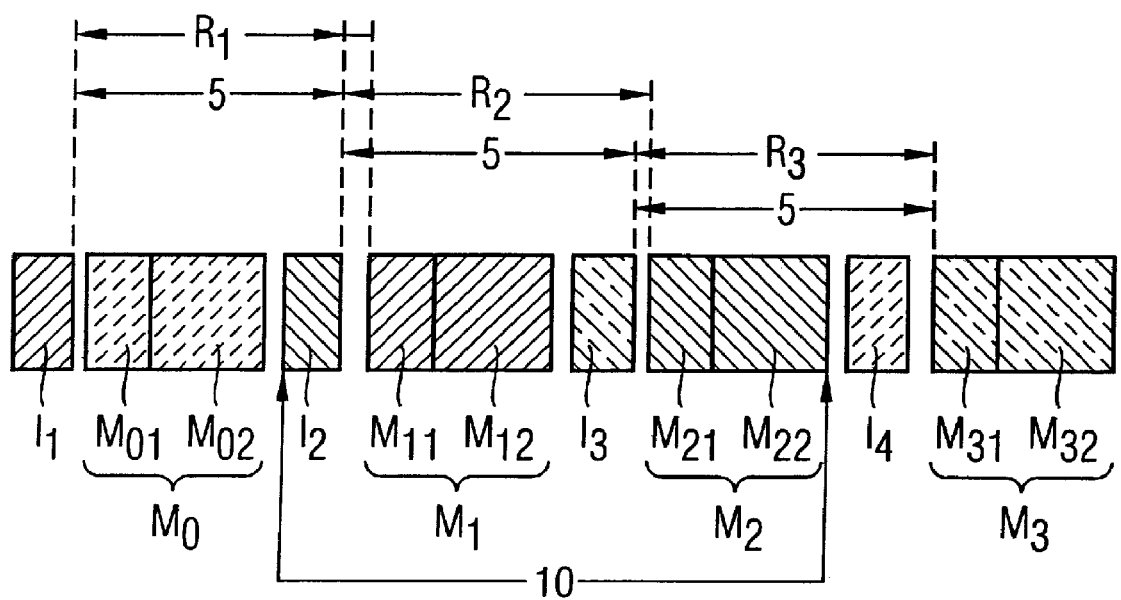
FIG. 4, as discussed above, schematically illustrates a known distributed acquisition scheme for a magnetic resonance tomography apparatus.

FIG. 1 through 4 were explained above.

As was already explained above, in IRTSE acquisition sequences for acquisition of resonance data, each measurement sequence requires an inversion phase lasting $T_A$ time units and an associated measurement phase which comprises a first measurement sub-phase for measurement preparation (measurement pulse) with time duration $T_E$ and at least one further measurement sub-phase (individual measurement) with a time duration $T_M$. In order to shorten the total time for acquisition of all resonance data of the slice planes of an examination, inversion phases and/or measurement phases of other slice planes can be implemented within the recovery phase generally fixed for a specific examination.

A combinatorial optimization problem thus must be solved for each examination, in which problem the following parameters are provided:

$n, s_1, \ldots, s_n \in N_+$ ($N_+$: set of the positive natural numbers) as a parameter for description of the slice planes.

Sequence parameters $T_E, T_M, T_A, T_{GAP}, T_R^{min}, T_R^{max} \in R_+$ (set of the positive real numbers) and $m_{min}, m_{max} \in N_+$ (set of the positive natural numbers), whereby $T_E$: constant time duration to be added per measurement sequence; $T_M$: time duration of an individual measurement of a measurement sequence; $T_A$: time duration of the inversion phase of a measurement sequence; $T_{GAP}$: time duration between inversion and measurement phase of the same measurement sequence; $T_R^{min}$: minimum repetition time between two measurement sequences of the same slice plane; $T_R^{max}$: maximum repetition time between two measurement sequences of the same slice plane; $m_{min}$: minimum number of the measurements per measurement phase; and $m_{max}$: minimum number of the measurements per measurement phase.

Sought in the combinatorial optimization problem are:
the number of the measurement phases k
an ascending series of beginning points in time of measurement sequences $t_1, \ldots, t_k$
the numbers of the measurements $m_1, \ldots, m_k \in [m_{min}, m_{max}]$ the association of the measurement sequences with slice planes $S_1, \ldots, S_n$ wherein the following conditions are to be observed:

The time intervals of the measurement sequences $[t_i, t_i+T_E+m_iT_M]$ as well as the preparation steps $[t_i-T_{GAP}-T_A, t_i-T_{TAP}]$ (inversion) are free of overlap.

The difference of the beginning points in time of successive measurement sequences of the same slice plane is allowable, thus:

$$t_j-t_i\in[T_R^{min},T_R^{max}] \text{ for all } i<j, S_i=S_j\neq S_k \text{ for } i<k<j.$$

The total count of the measurements associated with a slice plane corresponds to the line count of the slice plane, thus $$Z_i = \sum_{j|S_j=1} m_j$$

The total duration $t_k+T_E+m_k*T_M-t-t_{GAP}-t_A$ is minimum.

In order to solve this optimization problem, it is initially explained how the condition $T_R\in[T_R^{min}, T_R^{max}]$ (thus the requirement of an acceptance interval for the interval to be maintained between two measurements of the same slice plane (repetition time interval)) can be modeled.

A modeling is used that models the condition $T_R$ independent of the number of the slice planes and the number of the lines per slice plane. For this purpose the terms "stream" and "cliché" are defined.

Sets of sequence parameters $T_E$, $T_M$, $T_A$, $T_{GAP}$, $T_R^{min}$, $T_R^{max}\in R_+$ and $m_{min}$, $m_{max}\in N_+$ as well as $k\in N_+$ are considered.

An IRTSE acquisition scheme regarding $T_E$, $T_M$, $T_A$, $T_{GAP}$, $m_{min}$, $m_{max}$ is designated as $[T_R^{min}, T_R^{max}]$-compatible to the k-th degree when it applies for the start times $t_i$ of all measurement sequences that:

$$t_{i+k}-t_i\in[T_R^{min},T_R^{max}] \text{ for } t_{i+1}\geq t_i.$$

The k sets of measurement phases $\{M_i, M_{i+k}, M_{i+2k}, \ldots\}$ for $0\leq i\leq k$ are designated as streams.

A periodic IRTSE acquisition scheme that, temporally expanded, is $[T_R^{min}, T_R^{max}]$-compatible to the k-th degree, is designated as a cliché to the k-th degree.

Figure 5:
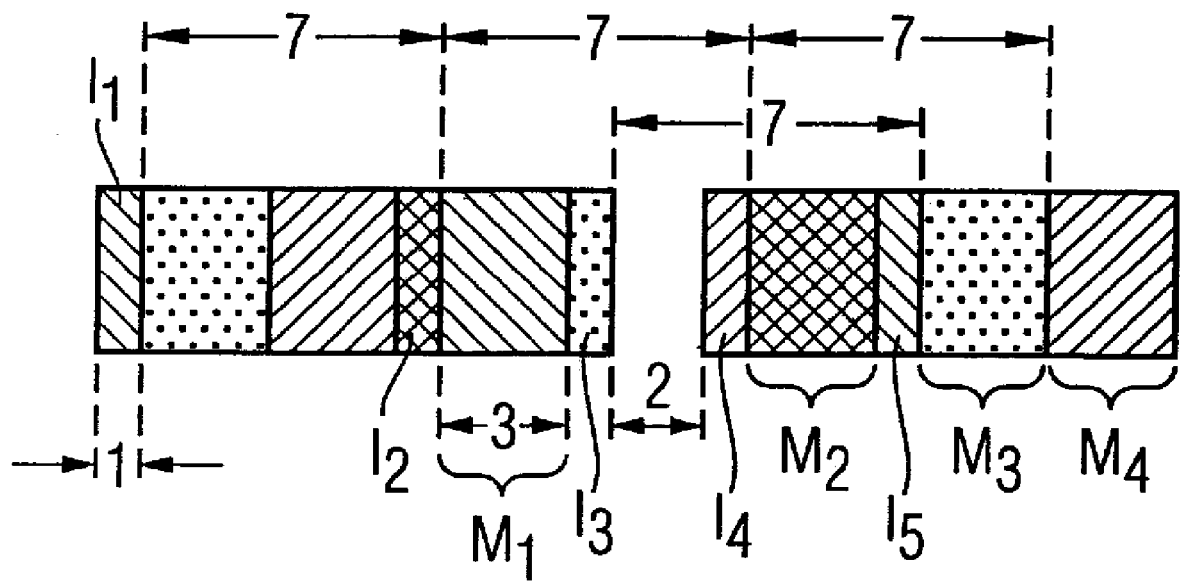
FIG. 5 schematically illustrates an exemplary embodiment of a periodic sequence of an IRTSE acquisition scheme in accordance with the invention.
Figure 6:
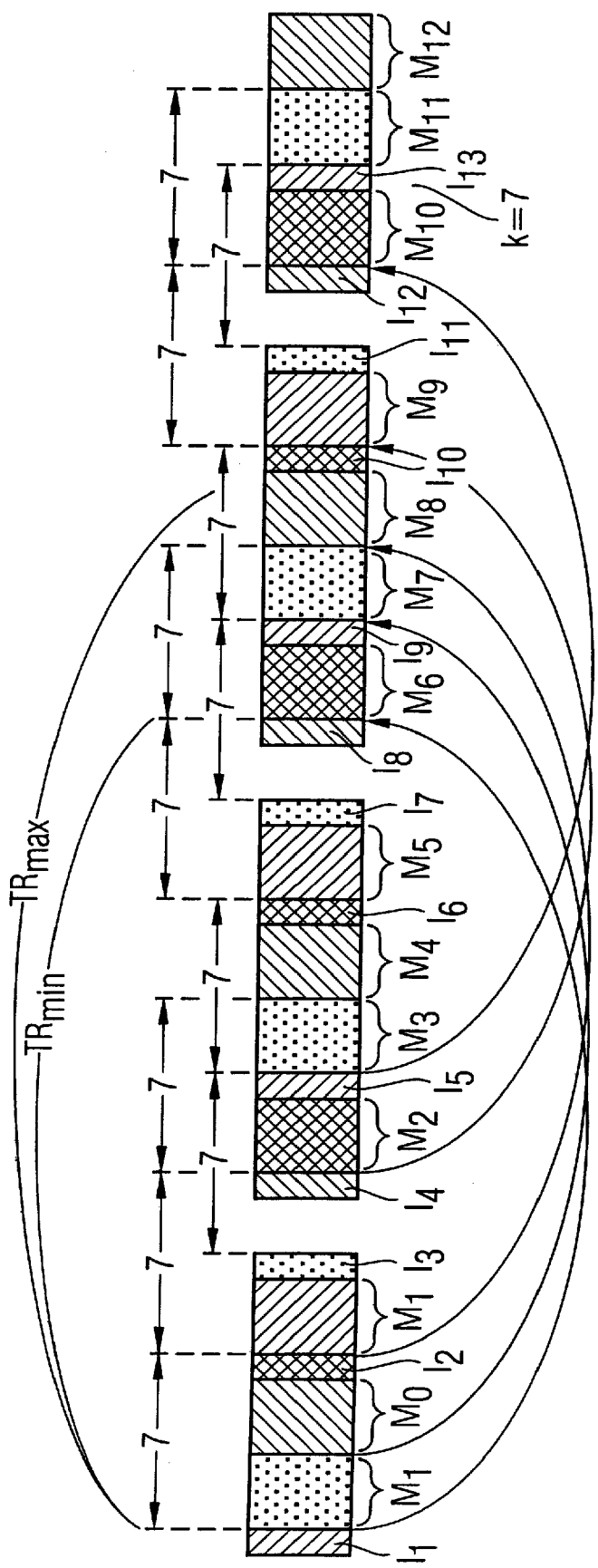
FIG. 6 schematically illustrates a cliché with 7 streams, based on the periodic sequence of FIG. 5.

In order to explain this in detail, reference is now made to FIGS. 5 through 7.

FIG. 5 exemplarily shows a periodic sequence, i.e. a periodic IRTSE acquisition scheme with regard to the parameters $T_E=T_A=1$, $T_{GAP}=7$, $T_M=2$ and $m_{min}=2$ and $m_{max}=1$. This scheme has four measurement phases with one measurement each and has a duration of 18 time units. The associated, expanded scheme is $T_R$-permissible for the interval [26, 36]. The specified number values respectively refer to time units.

A cliché with 7 streams (corresponding to respectively 7 different slice planes) is shown (k=7) in FIG. 6, based on the periodic sequence from FIG. 5. The "child [successor]" of the measurement phase $M_{-1}$ (i.e. a further measurement phase of the same slice plane) is accordingly the measurement phase $M_6$. The measurement phase $M_6$ starts 26=9+18 time units after the beginning of the measurement phase $M_{-1}$. Child of the measurement phase M1 is the measurement phase M8, child of the measurement phase M0 is the measurement phase M7, wherein the interval respectively amounts to 29 time units. This acquisition scheme is therewith a cliché to the 7th degree for the $T_R$ interval [26, 36].

In FIG. 7 it is shown that this acquisition scheme is simultaneously a cliché to the 8th degree (k=8), corresponding to 8 streams for different slice planes within the cliché. In this cliché the interval between two measurements in a stream is always precisely 36 time units.

In principle it applies that each periodic IRTSE acquisition scheme regarding $T_E$, $T_M$, $T_{GAP}$ with a duration $d\in[T_R^{min}, T_R^{max}]$ with m measurement phases is a cliché to the m-th degree. Such clichés are designated as "simple" clichés. It arises from this that the time interval between the i-th measurement phase and the i+m-th measurement phase is precisely d.

Furthermore, a cliché to the k-th degree is simple precisely when all intervals $t_{i+k}-t_i$ coincide and $m_{i+k}=m_i$ applies for the number of the measurements. In this case the scheme is periodic with the duration $t_{i+k}-t_i$.

If the periodic IRTSE acquisition scheme from FIG. 5 is run through twice in succession, a periodic scheme is obtained with length 36 and 8 measurement phases. The cliché to the 8th degree is thus a simple cliché.

In order to utilize clichés to solve a given combinatorial IRTSE sequence problem, an association of the slice planes with the streams and an order of the slice planes within the streams are required.

The calculation of optimal, simple clichés is inventively formulated as a MILP (MILP: Mixed-Integer Linear Program). MILP, i.e. the search for optimal solutions on the basis of a linear equation system using known algorithms, has long been known to the appropriate average man skilled in the art as a standard method for searching for a solution and does not need to be explained in detail here. MILP, for example, can be realized via a commercially-available "CPLEX" package. Here each MILP corresponds to the search for an optimally short, simple cliché with predetermined stream count and predetermined number of iterations with which a given set of slice planes can be measured with predetermined line count.

The problem is solved by a linear program with variables that are whole-number in part. The first natural variables are the beginning times $t_i$ of the measurement sequences and the number of the measurements $m_i$ that are thereby implemented. The generality $t_i=0$ can hereby be set without limitation.

The maximum number of required measurement sequences, and therewith the upper limit for the index i, is $$I = \sum_{s=1}^{S}\left\lceil\frac{Z_s}{m_{min}}\right\rceil = :\sum_{s=1}^{S} K_s$$

This number is clearly too large, such that a series of superfluous measurement sequences accrue that must be correspondingly coded in the following. For all $i\in\{1,\ldots,I\}$ it is required that $t_i$ is real and non-negative and that $m_i$ is a whole number between $m_{min}$ and $m_{max}$.

Form the fact that various measurement sequences may not overlap it follows that neither the initial phases nor the end phases may overlap, thus $t_i+T_A\leq t_{i+1}$ and $t_i+T_E+m_iT_M\leq t_{i+1}$ apply for all $1\leq i\leq I$.

It thus remains to be ensured that initial phases and end phases of different measurement sequences do not overlap. In principle there are two possibilities for this: either the phases are limited or they are not. This statement is encoded in binary variables: $x_{ij}$, $1\leq i<j\leq I$.

$X_{ij}=1$ means that the measurement sequences i and j are crossed [entangled], and $x_{ij}=0$ indicates the opposite. Thus:

$$x_{ij}=1 \Rightarrow t_j+T_A \leq t_i+T_A+T_{GAP}$$

and $$x_{ij}=\Rightarrow t_i+T_A+T_{GAP}+T_E+m_iT_M \leq t_j$$

With a "large number" G, this is then linearly modeled as $$t_j+T_A \leq t_i+T_A+T_{GAP}+G(1-x_{ij})t$$

and $$t_i+T_A+T_{GAP}+T_E+m_iT_M \leq t_j+Gx_{ij}t$$

It is therefore ensured that all slice planes are measured completely and with the correct time intervals. For this the beginning of the k-th measurement sequence of the slice plane s is labeled with the real non-negative variable $\tau_{sk}$ and the corresponding number of the measurements is labeled with $\mu_{sk}$. The latter variable is a whole number and lies between 0 and $m_{max}$, whereby $\mu_{sk}=0$ is used for the non-necessary measurement sequences. The condition with regard to the repetition time $T_R$ is then written as:

$$T_R^{min} \leq \tau_{s(k+1)}-\tau_{sk} \leq T_R^{max}$$

for all $1 \leq s \leq S$ and $1 \leq k < K$.

The completeness of the measurement is ensured by the condition $$\sum_{k=1}^{K_s} \mu_{sk} = Z_s$$

for all $1 \leq s \leq S$.

A number of binary variables is now introduced. For each measurement sequence $i \in \{1, \ldots, I\}$, $r_i=1$ means that this measurement sequence is utilized while $r_i=0$ means that it is superfluous.

For each measurement sequence [sic]$\leq i \leq I$, each slice plane [sic]$\leq s \leq S$ and each $1 \leq k \leq K_S$, $y_{isk}=1$ means that the slice plane is measured for the k-th time with the i-th measurement sequence. $y_{isk}=0$ means the opposite. The y-variable should impart a bijective association, thus $$\sum_{s=1}^{S} \sum_{k=1}^{K_s} y_{isk} = 1$$

for all $1 \leq i \leq I$ and $$\sum_{i=1}^{I} y_{isk} = 1$$

for all $1 \leq s \leq S$ and $1 \leq k \leq K_S$

Moreover, for all [sic] $i \leq I$ and [sic]$\leq s \leq S$ and $1 \leq k \leq K_S$ it must clearly apply that:

$$r_i=1 \hat{} y_{isk}=1 \Rightarrow t_i=\tau_{sk} \hat{} m_i=\mu_{sk}$$

and $$r_i=0 \hat{} y_{isk}=1 \Rightarrow \mu_{sk}=0$$

These implications are realized with a "large number" G.

The target function can now be introduced. This function to be minimized is equal to the real, non-negative variables t for which [sic] must apply. For all $1 \leq i \leq I$, $$r_i=1 \Rightarrow t_i+T_A+T_{GAP}+T_E+m_iT_M \leq t$$

The actual critical quantity is the number of the binary variables. This lies clearly in the order of magnitude $I^2$, such that presently no results can be determined within reasonable calculation times even for relatively low numbers of slice planes and lines.

The complexity of the program is therefore drastically reduced. The starting points in time of the measurement sequences are sought in a periodic form;

$$t=tt_N t_{N+}=t+tt_{N+}=t+t \ldots, t_{2N}=t_N+t, t_{2N+1}=t_1+2t, \ldots,$$
$$t_{KN}=t_N+K-t$$

The N "streams" of this "cliché" (K and N are constants) are hereby repeated K times. The variables $t, t_1, \ldots, t_N$ are real and non-negative. Moreover, $T_R^{min} \leq t \leq T_R^{max}$ applies.

The corresponding numbers of measurements are identified with the whole-number variables $m_1, \ldots, m_N \in \{m_{min}, m_{max}\}$.

The target function to be minimized is Kt.

(Temporal "junk (contamination) effects" at the beginning and at the end of the measurement of individual slice planes that could lead to a slight increase of the actual required measurement time are negligible.)

It furthermore applies: $1 \leq i \leq N$, $t_i+T_A \leq t_{i+1}$ and $t_iT_E+m_iT_M \leq t_{i+1}$, expanded by the periodic boundary condition $t_N+T_A \leq t_1+t$ and $t_N+T_E+m_NT_M \leq t_1+t$.

The binary variable $x_{ij}$, $1 \leq i < j \leq I$ codes the crossing measurement sequences, thus:

$$x_{ij}=1 \Rightarrow t_j+T_A \leq t_i+T_A+T_{GAP}$$

and $$x_{ij}=0 \Rightarrow t_i+T_A+T_{GAP}+T_E+m_iT_M \leq t_j$$

In order to guarantee the freedom from overlapping of $(r_{N+i})$-th and $(r_{(N+1)+j})$-th measurement sequence (i>j, greater N and only local overlaps are assumed), the binary variable $x_{ij}$, $1 \leq j < i \leq N$ is additionally defined and conveyed:

$$x_{ij}=1 \Rightarrow t_j+t+T_A \leq t_i+T_A+T_{GAP}$$

and $$x_{ij}=0 \Rightarrow t_i+T_A+T_{GAP}+T_E+m_iT_M \leq t$$

The association of slice planes with streams is coded in the binary variables $z_{is}$, $1 \leq i \leq N$ and $1 \leq s \leq S$. $z_{is}=1$ hereby means that the i-th stream processes the s-th slice plane; $z_{is}=0$ indicates the opposite. Exactly one stream is associated with each slice plane, thus $$\sum_{i=1}^{N} z_{is} = 1$$

applies for all $1 \leq s \leq S$, and no stream may be overloaded, i.e.

$$\sum_{s=1}^{S} z_{is} Z_S \leq Km_i$$

applies for all $1 \leq i \leq N$.

Here as well the "junk effect" is negligible. Given the slice plane change within a stream, it can occur that a measurement sequence is used simultaneously by the last measurements of a slice plane and the first measurements of the subsequent slice plane.

In the normal case the program so designed can be solved via quickly and efficiently. However, it has the disadvantage that it depends on both parameters N and K. A large series of such programs is thus to solved. In order to reduce the number of these programs, it is reasonable to link necessary conditions to (N, K). In the following a series of these is specified.

It makes little sense to have more streams than slice planes;

$$N \leq S$$

thus applies.

The minimum net time consumption of a measurement sequence is $\max\{T_A+T_E+m_{min}T_M, \phi m_{min}\}$, wherein $\phi$ is the minimum consumption of a measurement. $N\max\{T_A+T_E+m_{min}T_M, \phi m_{min}\} \leq T_R^{max}$ is thus necessary.

Due to the maximum number of measurements $m_{max}$ within a measurement sequence, necessarily $$\sum_{s=1}^{S} Z_S \leq KNm_{max} \text{ and } \max\{Z_S : 1 \leq s \leq S\} \leq Km_{max}.$$

If one knows the minimum time requirement in two regards, it thus applies:

$$\varphi \sum_{s=1}^{S} Z_S \leq KT_R^{max} \text{ and } T_M \sum_{s=1}^{S} Z_S + KN(T_A + T_E) \leq KT_R^{max}.$$

If N streams are provided for S slice planes, and $$r = \left[\frac{S}{N}\right],$$

S can be represented as $S=ar+(N-a)(r-1)$ with the aid of a natural number a. There are consequently a streams that process at least ar slice planes. Processed among these are at least W lines, with W being the sum of the ar "smallest" slice planes divided by a, so $$W \leq Km_{max}$$

applies.

If there was already a previous best solution $t_*$, the search can be further limited with the following conditions when second-best solutions are not of interest:

$$KT_R^{min} \leq t_*, NK\max\{T_A + T_E + m_{min}T_M, \varphi m_{min}\} \leq$$

$$t_* \text{ and } NK(T_A + T_E) + T_M \sum_{s=1}^{S} Z_S \leq T_*.$$

In the described method an acquisition sequence for acquisition of resonance data in an imaging method of a nuclear magnetic resonance tomograph is determined which, relative to the conventional acquisition methods, reduces the time duration for acquisition of the resonance data of all slice planes of an examination subject. Optimal periodic measurement sequences (clichés) are calculated for every single examination, whereby arbitrary crossings of the measurement sequences are enabled. The previously considered overlapping and distributed acquisition schemes can be comprised in the inventive acquisition method as "special cases". A savings potential of approximately 30% in the time duration for acquisition of the resonance data is realistic relative to the previously-used acquisition methods in which measurement sequences are for the most part generated with a fixed number of individual measurements.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for determining an acquisition sequence for acquisition of slice plane data for respective slice planes of an examination subject for generating slice images associated with the slice planes, comprising the steps of:
   using a magnetic resonance data acquisition unit,
   acquiring slice plane data by executing measurement sequences each comprising a preparation phase and a measurement phase temporally separated from the preparation phase;
   in each measurement phase, executing at least one measurement to acquire slice plane data;
   for n slice planes, and a set of sequence parameters comprising at least $T_r^{min}$ as a minimum repetition time between two measurement sequences for the same slice plane and $T_r^{max}$ as a maximum repetition time between two measurement sequences of the same slice plane, employing a periodic acquisition protocol comprising k data streams that, when temporarily expanded, is $[T_R^{min}, T_R^{max}]$-compatible to the k-th degree; and
   automatically determining an association of the n slice planes with the k data streams of said acquisition protocol, and an order of the slice planes within the respective data streams, using a mixed-integer linear program.

2. A method as claimed in claim 1 comprising determining a line-by-line association of said n slice planes with said k data streams in said acquisition protocol.

3. A method as claimed in claim 1 comprising maintaining respective numbers of measurements of said k data streams constant.

4. A method as claimed in claim 1 comprising employing a measurement phase in each measurement sequence comprising a first measurement sub-phase for measurement preparation and at least one further measurement sub-phase for acquisition of the said slice plane data.

5. A method as claimed in claim 1 comprising, as said preparation phase, employing an inversion phase of an RITSE magnetic resonance data acquisition sequence.

6. An electronic control device for a magnetic resonance tomography apparatus comprising a magnetic resonance scanner configured to interact with an examination subject to acquire slice plane data from slice planes of the examination subject for generating slice images of the examination subject associated with the slice planes, said electronic control device being programmed to acquire said slice plane data by acquiring slice plane data by executing measurement sequences each comprising a preparation phase; and a measurement phase temporally separated from the preparation phase; in each measurement phase, executing at least one measurement to acquire slice plane data; and for n slice planes, and a set of sequence parameters comprising at least $T_r^{min}$ as a minimum repetition time between two measurement sequences for the same slice plane and $T_r^{max}$ as a maximum repetition time between two measurement sequences of the same slice plane, employing a periodic acquisition protocol comprising k data streams that, when temporarily expanded, is $[T_R^{min}, T_R^{max}]$-compatible to the k-th degree; and automatically determining an association of the n slice planes with the k data streams of said acquisition protocol, and an order of the slice planes within the respective data streams, using a mixed-integer linear program.

7. A computer-readable medium encoded with a data structure, said medium being loadable into a control computer of a magnetic resonance system to control acquisition of slice plane data of slice planes of an examination subject in an imaging method for generating slice images associated with the slice planes, said magnetic resonance system having a magnetic resonance scanner and said data structure causing said control unit to:

acquire slice plane data by operating said scanner to execute measurement sequences each comprising a preparation phase and a measurement phase temporally separated from the preparation phase;

in each measurement phase, execute at least one measurement to acquire slice plane data;

for n slice planes, and a set of sequence parameters comprising at least $T_r^{min}$ as a minimum repetition time between two measurement sequences for the same slice plane and $T_r^{max}$ as a maximum repetition time between two measurement sequences of the same slice plane, employ a periodic acquisition protocol comprising k data streams that, when temporarily expanded, is $[T_R^{min}, T_R^{max}]$-compatible to the k-th degree; and automatically determine an association of the n slice planes with the k data streams of said acquisition protocol, and an order of the slice planes within the respective data streams, using a mixed-integer linear program.

* * * * *